US010840089B2

(12) United States Patent
Sakai et al.

(10) Patent No.: US 10,840,089 B2
(45) Date of Patent: Nov. 17, 2020

(54) PROTECTIVE-FILM FORMING METHOD FOR SEMICONDUCTOR SUBSTRATE

(71) Applicant: GLOBALWAFERS JAPAN CO., LTD., Niigata (JP)

(72) Inventors: Shin Sakai, Niigata (JP); Hiroaki Kariyazaki, Niigata (JP); Tatsuhiko Aoki, Niigata (JP); Koji Araki, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 165 days.

(21) Appl. No.: 16/089,456

(22) PCT Filed: Feb. 3, 2017

(86) PCT No.: PCT/JP2017/003924
§ 371 (c)(1),
(2) Date: Sep. 28, 2018

(87) PCT Pub. No.: WO2017/175465
PCT Pub. Date: Oct. 12, 2017

(65) Prior Publication Data
US 2020/0203159 A1    Jun. 25, 2020

(30) Foreign Application Priority Data

Apr. 4, 2016    (JP) .................................. 2016-074967

(51) Int. Cl.
*H01L 21/02* (2006.01)
*H01L 21/306* (2006.01)

(52) U.S. Cl.
CPC .. *H01L 21/02282* (2013.01); *H01L 21/30625* (2013.01)

(58) Field of Classification Search
CPC .................... H01L 21/02282; H01L 21/30625
See application file for complete search history.

(56) References Cited

U.S. PATENT DOCUMENTS 6,149,498 A * 11/2000 van Kessel ............ B65G 51/01
451/28
2003/0036570 A1 * 2/2003 Abe .................. H01L 21/02052
516/113

(Continued)

FOREIGN PATENT DOCUMENTS

EP    0493117 A2    7/1992
EP    1189265 A1    3/2002

(Continued)

OTHER PUBLICATIONS

Office Action dated Jan. 20, 2020, by the Korean Intellectual Prioerty Office in corresponding Korean Patent Application No. 10-2018-7029267. (5 pages).

(Continued)

*Primary Examiner* — Jay C Chang
*Assistant Examiner* — Mikka Liu
(74) *Attorney, Agent, or Firm* — Buchanan Ingersoll & Rooney PC

(57) ABSTRACT

A protective-film forming method for a semiconductor substrate suppresses deterioration in the number of LPDs and adhesion of impurities such as particles by forming a new protective-film of a surfactant solution when the semiconductor substrate is detached from a polishing head. The method includes a first protective-film forming process for forming a protective-film by hydrophilizing the front surface of the polished substrate with a surfactant solution and, after the first protective-film forming process, a second protective-film forming process for forming protective-films on the front and back surface of the substrate by detaching the substrate from the polishing head in a state where at least the front surface of the polished semiconductor substrate is in contact with the liquid surface of the protective-film forming treatment liquid comprising a surfactant solution, then by immersing the polished substrate in a protective-film forming treatment liquid.

7 Claims, 8 Drawing Sheets

(56) References Cited

U.S. PATENT DOCUMENTS

2006/0019582 A1* 1/2006 Chen .................. B24B 37/30
                                              451/41
2015/0147883 A1    5/2015 Huang

FOREIGN PATENT DOCUMENTS

| | | |
|---|---|---|
| JP | H08-197418 A | 8/1996 |
| JP | 2003-109931 A | 4/2003 |
| JP | 2007-050465 A | 3/2007 |
| JP | 2010-021353 A | 1/2010 |
| JP | 2013-045885 A | 3/2013 |
| KR | 10-2004-0058881 A | 7/2004 |
| KR | 10-0724883 B1 | 6/2007 |

OTHER PUBLICATIONS

International Search Report (PCT/ISA/210) dated Apr. 25, 2017, by the Japanese Patent Office as the International Searching Authority for International Application No. PCT/JP2017/003924.
Written Opinion (PCT/ISA/237) dated Apr. 25, 2017, by the Japanese Patent Office as the International Searching Authority for International Application No. PCT/JP2017/003924.
Extended Search Report issued by the European Patent Office in corresponding European Patent Application No. 17778844.5-1211 dated Oct. 21, 2019 (9 pages).

* cited by examiner

PROTECTIVE-FILM FORMING METHOD FOR SEMICONDUCTOR SUBSTRATE

TECHNICAL FIELD

The present invention relates to a method for forming a protective-film for a semiconductor substrate, and more particularly to a method for forming a protective-film for a semiconductor substrate to suppress adhesion of impurities such as particles, which are formed when the semiconductor substrate is detached from a polishing head.

BACKGROUND ART

Semiconductor substrates such as wafers are generally manufactured through steps, such as rough polishing, main polishing both by chemical mechanical polishing (CMP), rinsing treatment, hydrophilizing treatment, detaching a semiconductor substrate from a polishing head, cleaning the polished semiconductor substrate.

In recent years, higher integration and higher density of semiconductor devices require further suppression of adhesion of impurities such as particles to semiconductor substrates.

As a method for suppressing the adhesion of impurities, Patent Literature 1 proposes to improve the efficiency of removing particles on the wafer surface in a cleaning process in the post-process, by covering the polished surface with a surfactant solution on completion of the polishing, while the surfactant solution is supplied to the polisher table with slurry as abrasive at the same time during polishing.

The method for suppressing adhesion of impurities, described in Patent Literature 1, will be described with reference to FIG. 13.

As shown in FIG. 13, in this method for suppressing adhesion of impurities, a surfactant solution is discharged from a surfactant nozzle 4 to cover the back surface of a wafer W and thus to form a protective-film. The surfactant solution is further applied to flow from a nozzle 7 onto a polishing table 5, whereby the surface of the wafer W is covered with the surfactant, and thus a protective-film is formed.

Namely, the method of suppressing adhesion of impurities, described in Patent Literature 1, is intended to form a protective-film of the surfactant solution on the front surface and back surface of the wafer W, thereby suppressing the adhesion of impurities.

More specifically, the wafer W is taken out from a wafer cassette 2 by a loader 1 as shown in FIG. 13, and conveyed to under a wafer holding unit (polishing head) 3 by rotating an arm 1a of the loader 1. In this regard, the wafer W is held by the loader 1 such that the back surface thereof faces upward, and the surfactant solution is discharged from the surfactant nozzle 4 to wet the back surface of the wafer W and thus to form a protective-film.

Next, the wafer holding unit (polishing head) 3 descends and loads the wafer W. The wafer holding unit (polishing head) 3 moves in the direction of an arrow on the polishing table 5, and descends to press the wafer W against the rotating polishing table 5 while flowing the slurry from a slurry supply nozzle 6, thereby polishing the surface of the wafer W.

In addition, simultaneously with the supply of the slurry, the surfactant solution is applied to flow from the nozzle 7 onto the polishing table 5, thereby forming a protective-film of the surfactant solution on the surface of the wafer W on completion of the polishing of the wafer W.

When the polishing is completed, the wafer holding unit (polishing head) 3 ascends and moves in the direction of an arrow, descends again as indicated by an arrow, and stops. Then, the wafer W is transferred to an arm 8a of an unloader 8.

Next, the arm 8a of the unloader 8 rotates to store the wafer W in a wafer cassette 11 pulled up from pure water 10 in a liquid tank 9. Then, the wafer cassette 11 is lowered by an elevator mechanism, not shown, to immerse the polished wafers W into pure water 10. Thereafter, the wafer W is transferred to another liquid tank to clean the wafer W.

As just described, a protective-film is formed on the front surface and back surface of the wafer W by supplying the surfactant solution before the polishing step and during the polishing step.

As a result, even when the wafer W is exposed to the air in the conveyance of the wafer W by the wafer holding unit (polishing head) 3 after polishing, the front surface and back surface of the wafer W are both kept wet with the surfactant solution, that is, in a state where the protective-film formed; thus the efficiency of removing particles on the wafer surface is improved in the cleaning step.

CITATION LIST

Patent Literature

Patent Literature 1: Japanese Patent Application Laid-Open No. 08-197418

SUMMARY OF INVENTION

Technical Problem

According to the invention described in Patent Literature 1, before the polishing, the surfactant is supplied to the back surface of the wafer to form a protective-film. Even when the surfactant is sprayed only onto the back surface of the wafer, there is a possibility that the surfactant will also deposit on the wafer front surface, thereby forming a protective-film partially on the wafer front surface. There has been a technical problem that the partial formation of the protective-film deteriorates the surface roughness, or Haze, due to the difference in polishing rate between the formation part of the protective-film and the non-formation part.

In addition, according to the invention described in Patent Literature 1, the surfactant is supplied to the wafer surface during the polishing to form a protective-film, and thus arises a technical problem that the protective-film is formed on the polished surface during the polishing, thereby causing to decrease the polishing rate, and thus deteriorate the surface roughness (Haze).

In addition, according to the invention described in Patent Literature 1, the wafer is transferred from the wafer holding unit (polishing head) to the arm of the unloader, and there is thus a possibility that the protective-film of the surfactant will be peeled off at the contact of the wafer surface in contact with the arm. As a result, there has been a technical problem that impurities such as particles adheres to the site from which the protective-film is peeled off until the wafer is put into the liquid tank, thereby degrading the number of light point defects (LPD) at the site.

In addition, according to the invention described in Patent Literature 1, the protective-film is formed on the back surface of the wafer by supplying the surfactant solution before the polishing.

However, there is a possibility that, during the polishing process, the protective-film will be peeled off due to contact between the wafer holding unit (polishing head) and the back surface of the wafer, and there has been a technical problem that when the wafer is detached from the wafer holding unit (polishing head), impurities such as particles are likely to adhere, thereby degrading the number of LPDs on the back surface of the wafer.

Furthermore, according to the invention described in Patent Literature 1, the wafer transferred to the unloader is stored in the wafer cassette, and immersed in pure water.

However, the protective-film is likely to be peeled off by a water flow or water pressure in the pure water when immersed. In particular, when the liquid tank containing pure water is an overflow tank, there is a possibility that pure water will collide with the wafer at a predetermined water pressure, thereby peeling the protective-film of the surfactant formed on the wafer. Thus, there has been a technical problem of degrading the number of LPDs at the site from which the protective-film is peeled off.

The present invention has been made in order to solve the technical problems mentioned above, and an object of the invention is to provide a method for forming a protective-film for a semiconductor substrate, which suppresses a decrease in polishing rate, suppresses adhesion of impurities such as particles, and further suppresses degradation in the number of LPDs.

Solution to Problem

A method for forming a protective-film for a semiconductor substrate according to the present invention, made for achieving the object mentioned above, includes a step of first protective-film formation by hydrophilizing treatment with a surfactant solution to a front surface of a polished semiconductor substrate, after a polishing process that is performed using a polishing surface plate provided with a polishing head for holding a semiconductor substrate and a polishing cloth for polishing the semiconductor substrates attached to the surface plate and that is performed with the polishing head being pressurized and slid while an abrasive fluid is supplied between the polishing cloth and the semiconductor substrates; and a second protective-film forming step, after the first protective-film forming step, on a front surface and a back surface of the semiconductor substrate by immersing the polished semiconductor substrate in the protective-film forming treatment liquid, the polished semiconductor substrate being detached from the polishing head with at least the front surface of the polished semiconductor substrate in contact with a liquid surface of a protective-film forming treatment liquid comprising the surfactant solution.

As described above, the method for forming a protective-film for a semiconductor substrate according to the present invention includes the first protective-film forming step and the second protective-film forming step.

According to the present invention, forming the protective-film on the surface of the semiconductor substrate after the completion of the polishing, without forming any protective-film before the completion of the polishing, makes it possible to suppress a decrease in polishing rate, adhesion of impurities such as particles, and deterioration in the number of LPDs.

According to the present invention, the semiconductor substrate is detached from the polishing head, with at least the front surface of the polished semiconductor substrate in contact, thus it is possible to form a protective-film of the surfactant solution immediately on the back surface of the semiconductor substrate, and to suppress adhesion of impurities such as particles and degradation in the number of LPDs.

It is to be noted that it is preferable to detach the semiconductor substrate from the polishing head, with the whole semiconductor substrate immersed in the protective-film forming treatment liquid. In the case of detaching the whole semiconductor substrate immersed in the protective-film forming treatment liquid, the front surface and back surface of the semiconductor substrate are not exposed to the air, which is more preferable.

Furthermore, in the method for forming a protective-film for a semiconductor substrate according to the present invention, the semiconductor substrate is detached from the polishing head, and immersed in the protective-film forming treatment liquid comprising the surfactant solution.

Consequently, even when the liquid tank is an overflow tank and the surfactant solution collides against the semiconductor substrate at a predetermined water pressure, there is no possibility that the protective-film of the surfactant formed in the hydrophilizing treatment will be removed (the protective-film of the surfactant is maintained). When the protective-film forming treatment liquid is pure water, there is a possibility that the pure water will collide with the semiconductor substrate at a predetermined water pressure, to thereby peel the protective-film of the surfactant formed in the hydrophilizing treatment, which is not preferable.

As described above, in the method for forming a protective-film for a semiconductor substrate according to the present invention, the front surface and back surface of the semiconductor substrate are protected with the protective-films after the completion of the polishing; thus it is possible to suppress adhesion of impurities such as particles, and degradation in the number of LPDs.

The concentration of the surfactant in the protective-film forming treatment liquid is desirably from 1 to 50% by weight. More preferably, the concentration is from 30 to 50% by weight.

When the concentration is less than 1% by weight, the number of large defects, that is LPD increases and the protective-film is not formed sufficiently, which is not preferable. In addition, when the surfactant is used in excess of 50% by weight, the effect of suppressing the number of LPDs decreases, whereas the cost increases, which is not preferable.

When the surfactant concentration of the protective-film forming treatment liquid is higher than the concentration of the surfactant solution for use in the hydrophilizing treatment, a protective-film can be formed quickly on the back surface of the semiconductor substrate while detaching the semiconductor substrate from the polishing head, which is preferable.

Furthermore, desirably, a head body of the polishing head includes a recess that is open downward and intended to hold the semiconductor substrate therein, a flow passage for supplying an air pressure to a pressurized space, and a membrane formed of a dish-shaped elastic material, which is attached to cover and close the recess. The pressurization rate for the pressurized space is from 1 to 8 kPa/sec for detaching the semiconductor substrate from the polishing head. More preferably, the pressurization rate is from 5 to 8 kPa/sec.

The pressurization rate for the pressurized space is from 1 to 8 kPa/sec for detaching the semiconductor substrate from the polishing head, and this enables to detach the semiconductor substrate from the polishing head in a more reliable manner, and to immerse the semiconductor substrate in the protective-film forming treatment liquid simultaneously when detached.

When the pressurization rate is less than 1 kPa/sec, because of failing to detach the semiconductor substrate from the polishing head (membrane), or because of the low speed of detaching the semiconductor substrate, there might be a concern that it will be impossible to immerse the semiconductor substrate in the protective-film forming treatment liquid simultaneously when detached. In contrast, when the pressurization rate exceeds 8 kPa/sec, there is a possibility that the membrane will be broken.

Advantageous Effects of Invention

The present invention allows obtaining a method for forming a protective-film for a semiconductor substrate can be obtained that suppresses a decrease in polishing rate, suppresses adhesion of impurities such as particles, and further suppresses degradation in the number of LPDs.

DESCRIPTION OF EMBODIMENTS

Hereinafter, a method for forming a protective-film for a semiconductor substrate according to the present invention will be described with reference to FIGS. 1 to 4.

The method for forming a protective-film for a semiconductor substrate according to the present invention is applied after a rough polishing step A, a main polishing step B, a rinsing treatment step C (the series of steps is referred to as a polishing step X) and before a cleaning step G of cleaning the polished substrate.

Figure 1:
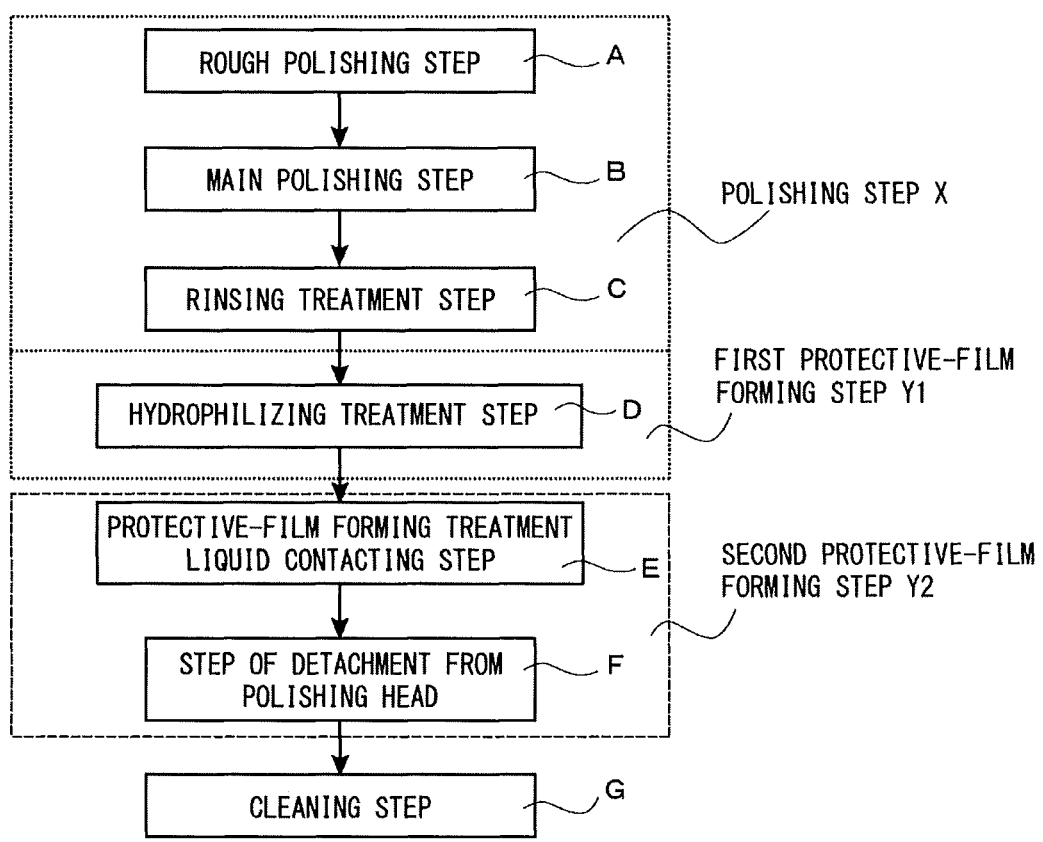
FIG. 1 is a flowchart showing a method for forming a protective-film for a semiconductor substrate according to the present invention.

The method for forming a protective-film for a semiconductor substrate according to the present invention, as shown in FIG. 1, includes a first protective-film forming step Y1 and a second protective-film forming step Y2.

Specifically, the method includes the first protective-film forming step Y1 in the hydrophilizing treatment step D for hydrophilizing a wafer without forming a protective-film before completion of polishing, and the second protective-film forming step Y2 consisting of a protective-film forming treatment liquid contacting step E in which the wafer is brought into contact with a protective-film forming treatment liquid after the hydrophilizing treatment step D (first protective-film forming step Y1), and a detachment step F of detaching the wafer from a polishing head.

The first protective-film forming step Y1 is a step of forming a protective-film on a front surface of the wafer (polished surface), and the protective-film reduces an increase in the number of LPDs on the wafer surface after the completion of polishing, in particular, in the case of transference of the wafer.

In addition, the second protective-film forming step Y2 is a step of forming a new protective-film on a back surface of the wafer, exposed when the wafer is detached, and the protective-film reduces an increase in the number of LPDs on the back surface of the wafer.

Thus, the formation of the protective-films on the front surface and back surface of the wafer by the first protective-film forming step Y1 and the second protective-film forming step Y2 as can reduce an increase in the number of LPDs, not only on the front surface but also on the back surface of the wafer.

Furthermore, with reference to FIGS. 2A and 2B, the method for forming a protective-film for a semiconductor substrate of the present invention will be described. It is to be noted that the same or corresponding members are denoted by the same reference numerals, and descriptions thereof will be omitted because the polishing apparatus shown in FIGS. 2A and 2B has the same configuration as the polishing apparatus shown in FIG. 13.

Figure 2A:
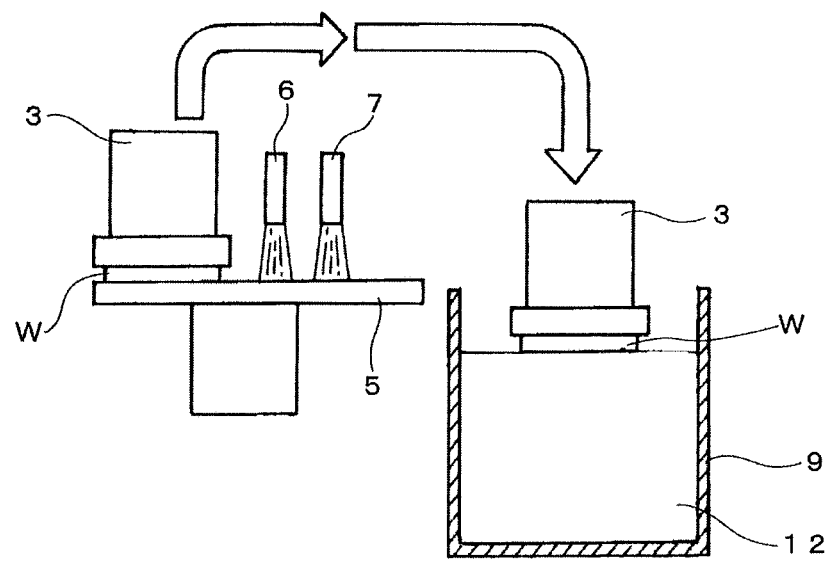
FIGS. 2A and 2B are a schematic configuration diagram of a polishing apparatus for explaining the protective-film forming step shown in FIG. 1.
Figure 2B:
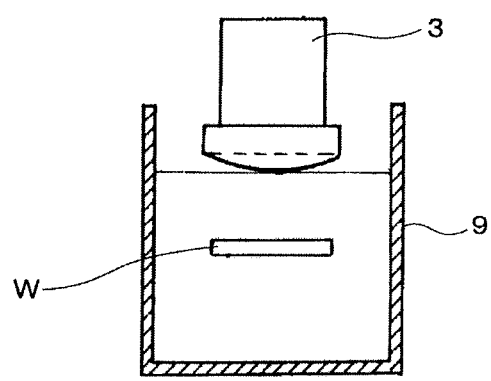
Figure 13:
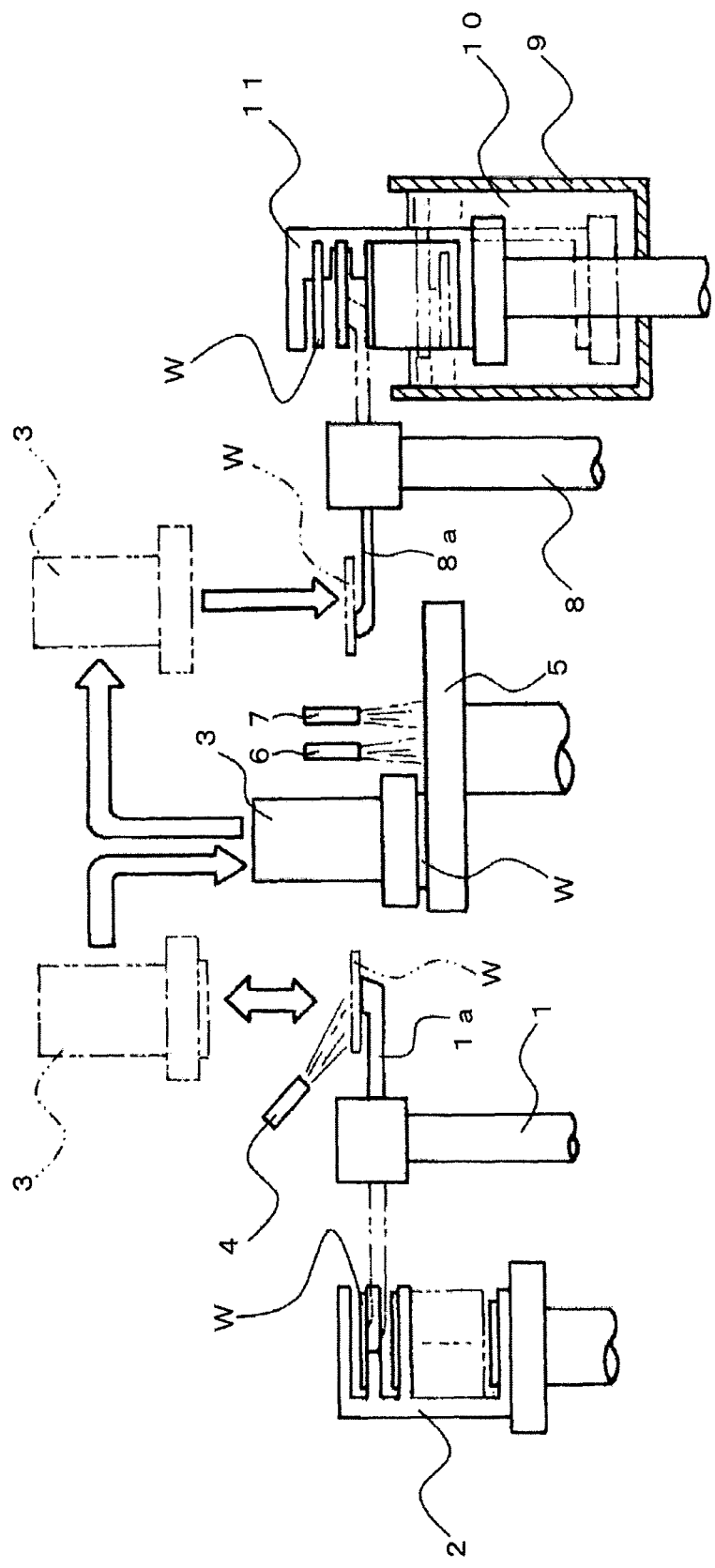
FIG. 13 is a diagram illustrating a method for manufacturing a semiconductor substrate as described in Patent Literature 1.

The polishing apparatus shown in FIGS. 2A and 2B is not provided with an unloader like the polishing apparatus shown in FIG. 13. For a wafer W on which the polishing step X has been completed, a surfactant solution is supplied from a nozzle 7 onto a polishing table 5 (hydrophilization treatment), thereby forming a protective-film of the surfactant solution on the front surface of the wafer W (first protective-film forming step).

Subsequently, the wafer W is conveyed to a liquid tank 9 with a polishing head 3, and immersed in a protective-film forming treatment liquid 12 in the liquid tank 9; then the protective-film forming treatment liquid contacting step E and the detaching step F (second protective-film forming step Y2) are carried out.

As the protective-film forming treatment liquid 12, a surfactant solution is used. In addition, an overflow tank is used as the liquid tank 9.

As the polishing head 3 (the wafer holding unit shown in FIG. 13), a commonly used polishing head can be used. An example thereof is shown in FIG. 4.

Figure 4:
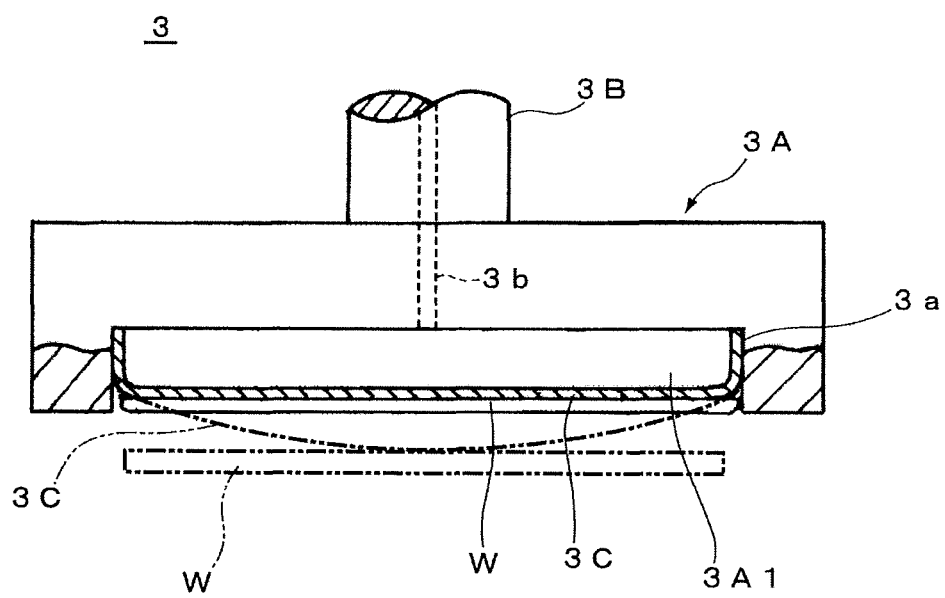
FIG. 4 is a schematic cross-sectional view of a polishing head.

The polishing head 3 shown in FIG. 4 includes a head body 3A and a rotating shaft 3B. The rotating shaft 3B is attached to a conveying means (not shown), and configured to convey the polishing head 3.

In addition, the head body 3A is provided with a recess 3a that is open downward and intended to hold the wafer W therein, and a flow passage 3b for supplying the air pressure to a pressurized space 3A1.

Reference numeral 3C denotes a membrane, which is attached to the head body 3A to cover and close the recess 3a as shown in FIG. 4, and formed of a substantially dish-shaped elastic material wholly made of rubber, for example.

Thus, the pressurized space (airtight space) 3A1 is formed in the recess 3a, and configured such that the wafer W can be pressurized to contact to a polishing cloth.

Then, for detaching the wafer W from the polishing head 3, air is supplied to the pressurized space 3A1 via the flow passage 3b to deform the membrane 3C into a curved shape projecting downward. As indicated by the two-dot chain line in FIG. 4, due to the deformation of the membrane 3C, the wafer W is, from the outer periphery toward the center, gradually separated from the polishing head 3 (membrane 3C), and the wafer W is detached from the polishing head 3 (membrane 3C).

Returning to FIGS. 2A and 2B, the method for forming a protective-film for a semiconductor substrate according to the present invention will be specifically described.

Although not shown in FIG. 2A, similarly as in the case shown in FIG. 13, the wafer W is taken out from a wafer cassette 2 by a loader 1, and an arm 1a of the loader 1 is rotated to convey the wafer W to below the polishing head 3. In this moment, unlike the conventional case, no surfactant solution is supplied to the back surface of the wafer. This is because if the surfactant solution supplied to the back surface of the wafer deposits to the front surface of the wafer before polishing, the polishing rate is partially decreased, thereby deteriorating the surface roughness (Haze), which is not preferable.

Next, the polishing head 3 moves lower to mount the wafer W. The polishing head 3 moves onto the polishing table 5, and presses the wafer W against the polishing table 5 rotating while flowing slurry from a slurry supply nozzle 6; thus the surface of the wafer W is polished.

In addition, after the polishing of the wafer W is completed, the rinse treatment step and the hydrophilization treatment step (first protective-film formation step Y1) for covering the surface of the wafer W with a surfactant are performed.

The hydrophilization treatment step D for hydrophilizing the wafer, which is performed before the protective-film forming treatment liquid contact step E (second protective-film forming step Y2), supplies a surfactant solution as a hydrophilization treatment agent between a polishing cloth for polishing the wafer W and the wafer W, and forms a protective-film on the front surface of the wafer (polished surface); it is the first protective-film formation step Y1. This protective-film reduces an increase in the number of LPDs on front surface of the wafer after the completion of the polishing, in particular, in the case of transference of the wafer.

In the hydrophilizing treatment step D, it is more preferable to pressurize the polishing head at 3 to 6 kPa and set the rotation speed of the polishing head at 20 to 40 rpm.

In this regard, when the pressure applied to the polishing head is less than 3 kPa or more than 6 kPa, a protective-film is not adequately formed on the wafer W by the hydrophilizing treatment, which is not preferable.

In addition, when the rotation speed of the polishing head is less than 20 rpm, a protective-film is not adequately formed on the wafer W by the hydrophilizing treatment in the same manner as described previously. In contrast, when the rotation speed of the polishing head exceeds 40 rpm, there is a possibility that the protective-film formed by the hydrophilizing treatment may be detached, which is not preferable.

As the surfactant for use in the hydrophilizing treatment, surfactants such as a water-soluble anionic surfactant, a water-soluble nonionic surfactant, and a water-soluble amphoteric surfactant can be used without any particular limitation, but it is preferable to use a water-soluble nonionic surfactant or a water-soluble amphoteric surfactant. Examples of the water-soluble nonionic surfactant include polyethylene glycol dilaurate acid ester, tridecyl polyoxyethylene ether, nonylphenyl polyoxyethylene ether, and polyethylene glycol monostearate, and surfactants having an HLB (hydrophilic/lipophilic balance) of 10 or more are preferable. Examples of the amphoteric surfactant include N-alkyl sulfobetaine-modified silicone oil, N-alkyl nitrilotriacetic acid, N-alkyl dimethyl betaine, α-trimethylammonio fatty acid, N-alkyl β-aminopropionic acid, N-alkyl β-iminodipropionate, N-alkyloxymethyl-N, N-diethyl betaine, 2-alkylimidazoline derivatives, and N-alkylsulfobetaine.

In addition, the concentration of the surfactant solution for use in the hydrophilizing treatment is preferably from 1 to 50% by weight.

When the concentration of the surfactant is less than 1% by weight, the protective-film is not adequately formed, thereby increasing the number of large defects such as light point defects (LPD), which is not preferable. In addition, when the surfactant is used in excess of 50% by weight, the effect of suppressing the number of LPDs decreases, whereas the cost is increased, which is not preferable.

Then, after the completion of the hydrophilizing treatment step D (first protective-film forming step Y1), as shown in FIG. 2A, the polishing head 3 conveys the wafer W to the liquid tank 9 in which the protective-film forming treatment liquid 12 is contained, and places the wafer W at a position with at least the surface of the wafer W in contact with the liquid surface of the protective-film forming treatment liquid 12.

Thereafter, as shown in FIG. 2B, and FIG. 4, air is supplied into the pressurized space 3A1 with the pressurization rate in the range from 1 to 8 kPa/sec; this causes the membrane 3C to deform into a curved shape projecting downward and then gradually to remove the membrane 3C from the outer peripheral part of the wafer W toward the center.

This detaching from the polishing head 3 (membrane 3C) results in immersion of the wafer W in the protective-film forming treatment liquid 12, thereby forming a protective-film (second protective-film forming step Y2).

As just described, the second protective-film forming step Y2 is a step of forming a new protective-film on the back surface of the wafer, exposed when the wafer is detached, and the protective-film reduces an increase in the number of LPDs on the back surface of the wafer.

The pressurization rate falls within the range of from 1 to 8 kPa/sec; thus, it is possible to immerse the wafer in the protective-film forming treatment liquid 12 simultaneously with the detachment of the wafer W, and also to prevent the membrane from breakage.

Figure 3:
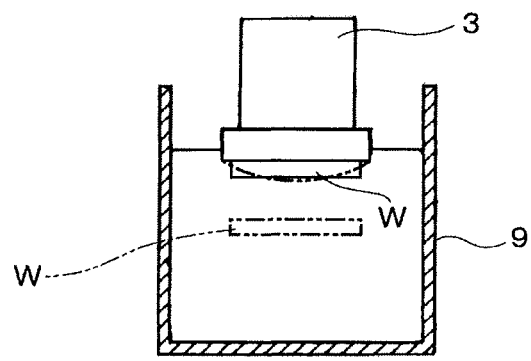
FIG. 3 is a diagram illustrating a modified example of the protective-film forming step shown in FIG. 1.

In addition, a case of detaching the wafer W located in a position where the front surface of the wafer W is in contact with the liquid surface of the protective-film forming treatment liquid 12 has been described. As shown in FIG. 3, however, it is more preferable to detach the wafer W from the polishing head 3 (membrane 3C), with the back surface of the wafer W immersed in the protective-film forming treatment liquid 12 (with the whole wafer W immersed therein).

When the entire wafer W is detached with the whole wafer being immersed in the protective-film forming treatment liquid 12, a protective-film can be formed without exposing the front surface and back surface of the wafer W to the atmosphere at all.

As a surfactant for the protective-film forming treatment liquid, water-soluble anionic surfactants, water-soluble nonionic surfactants, and water-soluble amphoteric surfactants can be used without any particular limitation.

Preferably, examples of the water-soluble nonionic surfactant include polyethylene glycol dilaurate acid ester, tridecyl polyoxyethylene ether, nonylphenyl polyoxyethylene ether, and polyethylene glycol monostearate, and surfactants are preferred that have an HLB (hydrophilic/lipophilic balance) of 10 or more. Examples of the amphoteric surfactant include N-alkyl sulfobetaine-modified silicone oil, N-alkyl nitrilotriacetic acid, N-alkyl dimethyl betaine, α-trimethyl ammonio fatty acid, N-alkyl β-aminopropionic acid, N-alkyl β-iminodipropionate, N-alkyloxymethyl-N, N-diethyl betaine, 2-alkylimidazoline derivatives, and N-alkylsulfobetaine.

In addition, the concentration of the surfactant in the protective-film forming treatment liquid is preferably from 1 to 50% by weight. More preferably, the concentration is preferably from 30 to 50% by weight.

When the concentration of the surfactant is less than 1% by weight, the protective-film is not adequately formed, thereby increasing the number of large defects (LPD; Light Point Defects), which is not preferable. In addition, when the surfactant is used in excess of 50% by weight, the effect of suppressing the number of LPDs decreases, whereas the cost increases, which is not preferable.

Furthermore, in the method for detaching a semiconductor substrate according to the present invention, when the concentration of the hydrophilizing treatment solution (surfactant solution) for use in the hydrophilizing treatment step D (first protective-film forming step Y1) is higher than the concentration of the protective-film forming treatment liquid (surfactant solution), a protective-film can be quickly formed on the back surface of the wafer in detaching the wafer from the polishing head, which is preferable.

As described above, according to the method for forming a protective-film for a semiconductor substrate, the protective-film is formed on the semiconductor substrate after the completion of polishing without forming any protective-film before the completion of polishing, thus making it possible to keep the polishing rate from being decreased.

Furthermore, since the wafer W is moved directly into the liquid tank 9 from the polishing head 3 without transferring the wafer from the polishing head 3 to an arm of an unloader, the protective-film of the surfactant (hydrophilizing treatment solution) is prevented from peeling at a contact point where the wafer W is in contact with an arm as happened in a conventional case.

Moreover, with at least the surface of the wafer W located in contact with the liquid surface of the protective-film forming treatment liquid 12, the wafer W is detached from the polishing head 3, and immersed in the protective-film forming treatment liquid (surfactant solution) 12.

Therefore, simultaneously with detachment, the wafer can be immersed in the protective-film forming treatment liquid, and a protective-film can be quickly formed on the back surface of the wafer.

Furthermore, since the wafer W is detached from the polishing head 3 and immersed in the protective-film forming treatment liquid (surfactant solution) 12. Consequently, there is no possibility that the protective-film of the surfactant formed on the wafer W will be removed even when an overflow tank is used as liquid tank 9, and the protective-film forming treatment liquid 12 collides with the wafer W at a predetermined water pressure.

Thus, an increase in the number of LPDs not only on the front surface but also on the back surface of the wafer can be reduced by formation of protective-films on both surfaces of the wafer by performing the first protective-film forming step Y1 and the second protective-film forming step Y2.

The method for detaching a semiconductor substrate according to the present invention can be used for single-crystalline silicon wafers, as well as SiC and other semiconductor substrates. In addition, the method can be applied not only to single-side polishing but also to double-side polishing.

EXAMPLES

Hereinafter, the present invention will be described more specifically with reference to examples, but the scope of the present invention is not to be limited by the following examples.

Examples 1 to 7, Comparative Example 1

A single-crystalline silicon wafer having a diameter of 300 mm was polished with the use of a common single-wafer type polishing apparatus. In the single-wafer type polishing apparatus used in the examples, polishing was carried out by sequentially moving the polishing head on which the wafer is mounted through three polishing tables.

Specifically, a rough polishing step, a main (precision) polishing step, a rinsing treatment step, and a hydrophilizing treatment step (first protective-film forming step) were carried out on a polishing table under the conditions shown in Table 1.

Pure water is used as the rinsing treatment solution. In addition, a surfactant solution composed of a water-soluble nonionic surfactant at a concentration of 1% by weight was used as the hydrophilizing treatment liquid.

Thereafter, moved to the second protective-film forming step, the wafer is detached from the polishing head with the wafer surface in contact with a protective-film forming treatment liquid in an overflow tank. At this time, the pressurization rate was adjusted to 5 kPa/sec.

TABLE 1

| STEP | Head Rotation Speed (rpm) | Pressure (kPa) |
| --- | --- | --- |
| Rough Polishing | 45-55 | 3-6 |
| Precision Polishing | 60-85 | 8-12 |
| Rinsing Treatment | 20-40 | 3-6 |
| Hydrophilizing Treatment | 20-40 | 3-6 |

The protective-film forming treatment liquid used has the same composition as the hydrophilizing treatment liquid but differs in concentration in each example: 0.5% by weight for Example 1, 0.8% by weight for Example 2, 1% by weight for Example 3, 10% for Example 4, 30% by weight for Example 5, 50% by weight for Example 6 and 80% by weight for Example 7.

Then, the number of LPDs on the silicon wafer larger than 26 nm was measured with a laser scattering particle counter (Surfscan SP-3 manufactured by KLA-Tencor Corporation). The measurement region was a whole region excluding 3 mm outer circumference.

The correlation between the number of LPDs larger than 26 nm on the measured silicon wafer and the concentration of the surfactant is shown in FIGS. 5 to 8.

In addition, as Comparative Example 1, the polishing and hydrophilizing treatment were carried out similarly as in Examples 1 to 7, and with the wafer surface in contact with pure water (protective-film forming treatment liquid containing surfactant 0% by weight) in an overflow tank, the wafer was detached from the polishing head. Then, as in Examples 1 to 7, the number of LPDs was measured that was larger than 26 nm on the silicon wafer.

The correlation between the number of LPDs larger than 26 nm on the measured silicon wafer and the concentration of the surfactant is shown in FIGS. 5 to 8.

Figure 5:
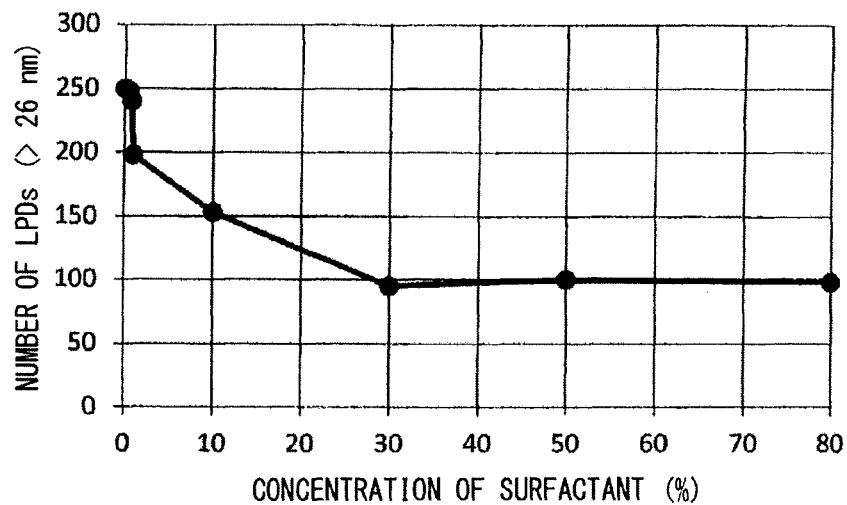
FIG. 5 is a graph showing an experimental result of verifying the number of LPDs with respect to the concentration of a surfactant.
Figure 6:
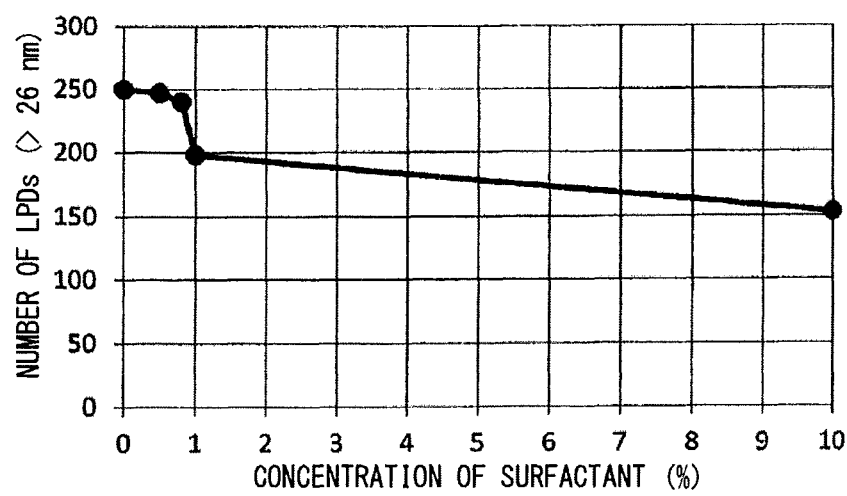
FIG. 6 is an enlarged view of the concentration of the surfactant from 0 to 10% in FIG. 5.
Figure 7:
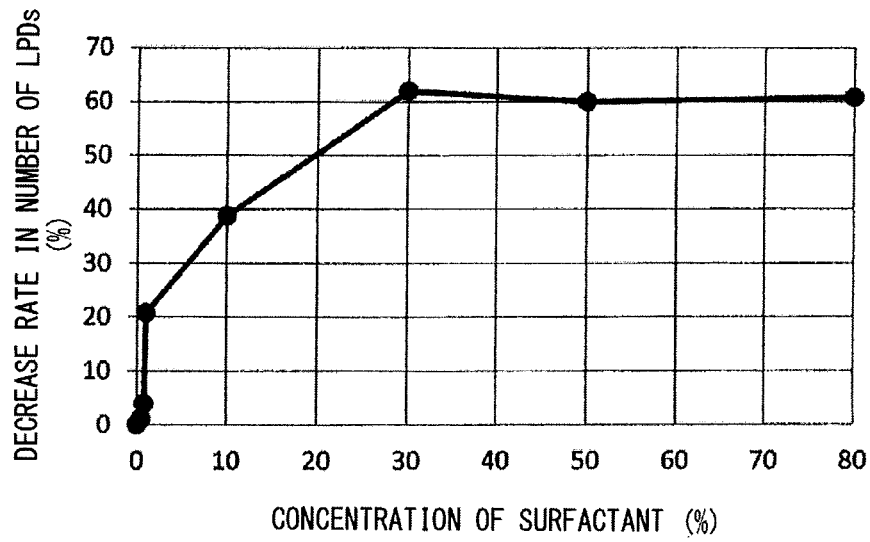
FIG. 7 is a graph showing the experimental result shown in FIG. 5 as the rate of decrease in the number of LPDs with respect to the concentration of the surfactant.
Figure 8:
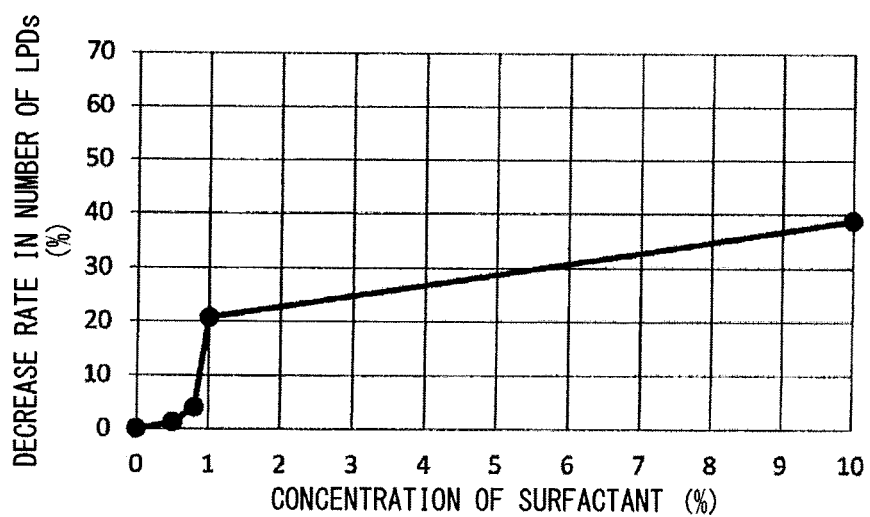
FIG. 8 is an enlarged view of the concentration of the surfactant from 0 to 10% in FIG. 7.

As can be seen from FIG. 5 and FIG. 6, a slight decrease in the number of LPDs was observed when the concentration of the surfactant as the protective-film forming treatment liquid was 0.5% by weight and 0.8% by weight. Further, the number of LPDs was sharply decreased when the concentration was in the vicinity of 1% by weight, and the number of LPDs was gradually decreased as the concentration is increased in the range from 1 to 30% by weight, and any change of the number of LPDs was not observed in excess of 30% by weight. This is also apparent from the rate of decrease in the number of LPDs as shown in FIGS. 7 and 8.

Thus, the concentration of the surfactant as the protective-film forming treatment liquid is preferably from 0.5 to 50% by weight. More preferably, the concentration is from 1 to 50% by weight. Further, the concentration is preferably from 30 to 50% by weight.

Example 5, Comparative Examples 2 and 3

The polishing rate and the surface roughness (Haze) were compared in the case of Example 5, the case of Comparative Example 2 where the surfactant was sprayed onto the back surface of the wafer before polishing, and the case of Comparative Example 3 where the surfactant was supplied during the polishing.

Specifically, in Example 5, a rough polishing step, main (precision) polishing, a rinsing treatment, and a hydrophilizing treatment (first protective-film forming step) were carried out on a polishing table under the conditions shown in Table 1 above. Thereafter, with the wafer surface in contact with the protective-film forming treatment liquid in an overflow tank, the wafer was detached from the polishing head, and the wafer was immersed in the overflow tank. A surfactant solution including a water-soluble nonionic surfactant at a concentration of 1% by weight was used as the hydrophilizing treatment liquid, and as the protective-film forming treatment liquid, the same composition as the hydrophilizing treatment liquid was used at a concentration of 30% by weight.

Figure 9:
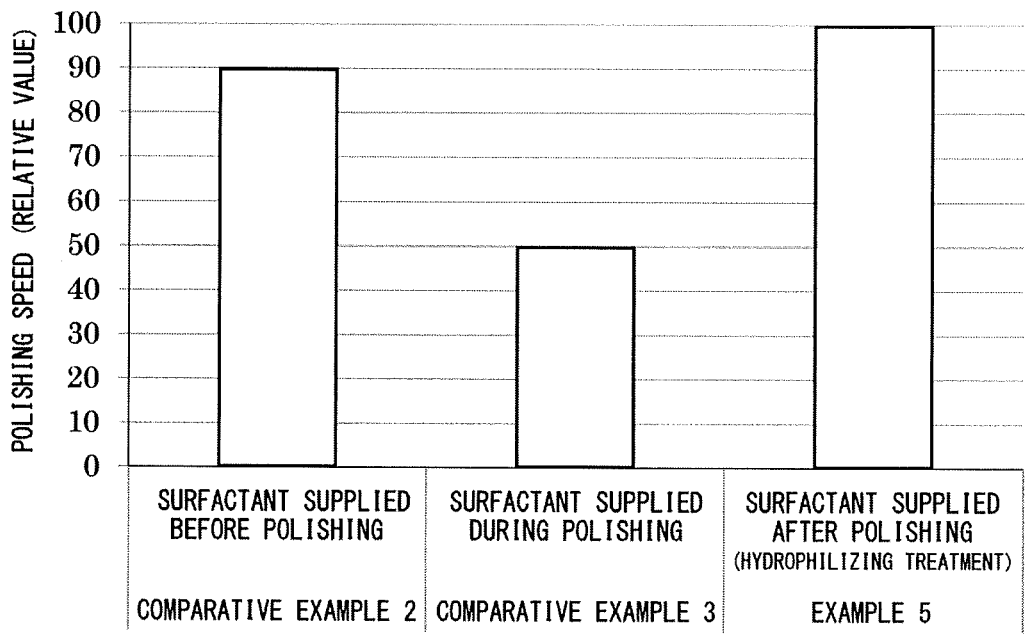
FIG. 9 is a diagram showing the results of polishing rate according to Example 5 and Comparative Examples 2 and 3.
Figure 10:
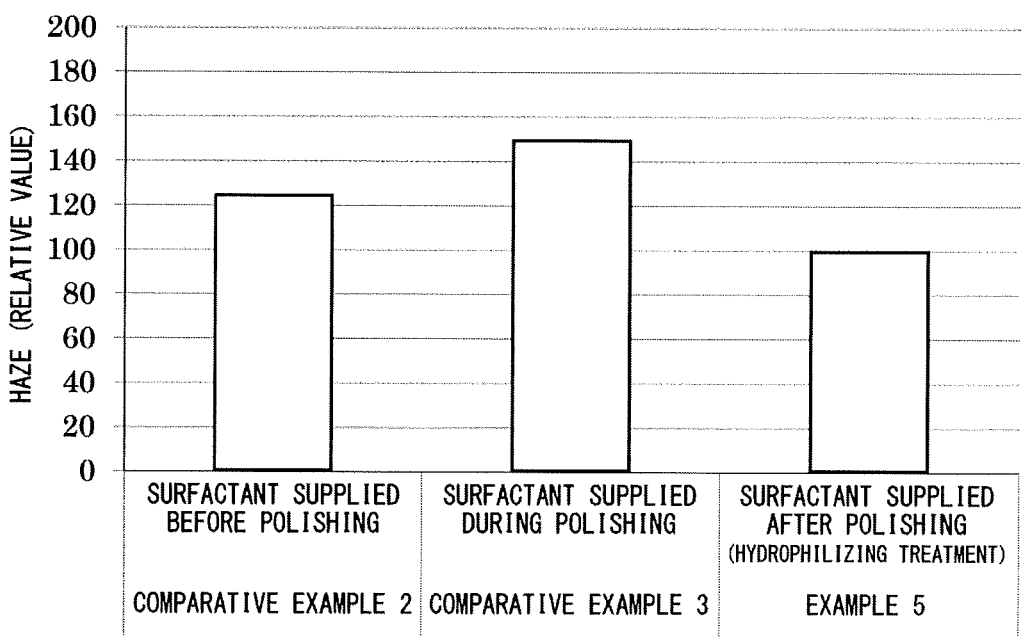
FIG. 10 is a diagram showing the results of surface roughness (Haze) according to Example 5 and Comparative Examples 2 and 3.

Thereafter, the polishing rate and the surface roughness (Haze) were measured. The polishing rate was calculated by dividing the amount of wafer thickness change before and after polishing, measured with a wafer geometry metrology system (WaferSight manufactured by KLA-Tencor), by the total time of rough polishing and precision polishing. The surface roughness (Haze) was also measured with a laser scattering particle counter (Surfscan SP-3 manufactured by KLA-Tencor Corporation). With respect to the polishing rate and Haze, the values in Comparative Examples 2 and 3 are compared with the values under the condition of Example 5 in the relative numbers, and the results are shown in FIG. 9 and FIG. 10, respectively.

In Comparative Example 2, prior to polishing, a surfactant including a water-soluble nonionic surfactant at a concentration of 1% by weight was sprayed onto the back surface of the wafer. Except this process, the wafer was processed under the same condition as Example 5.

In addition, in Comparative Example 3, a surfactant including a water-soluble nonionic surfactant at a concentration of 1% by weight was supplied during polishing. Except this condition, the wafer was processed under the same condition as Example 5.

For Comparative Example 2 and Comparative Example 3, the polishing rate and surface roughness (Haze) were measured in the same manner as in Example 5. The results are shown in FIGS. 9 and 10.

As is clear from FIGS. 9 and 10, it is found that a decrease in the polishing rate and deterioration of surface roughness are reduced by supplying a surfactant at a time of hydrophilizing treatment after polishing (formation of the first protective-film), rather than by supplying a surfactant before or during polishing.

Example 5, Comparative Example 4

The number of LPDs of the wafers was compared, in one case the wafer is taken out using the unloader as shown in the conventional example (Comparative Example 4) and in the other case the wafer is detached from the polishing head, without using the unloader (Example 5), with the wafer front surface in contact with the protective-film forming treatment liquid.

Specifically, in Comparative Example 4, after the polishing process was conducted under the same condition as in Example 5, the wafer was detached from the polishing head, transferred to the unloader, and immersed in an overflow tank. Thereafter, the number of LPDs was measured by the same method as in Example 5. The result is shown in FIG. 11 together with the result of Example 5.

Figure 11:
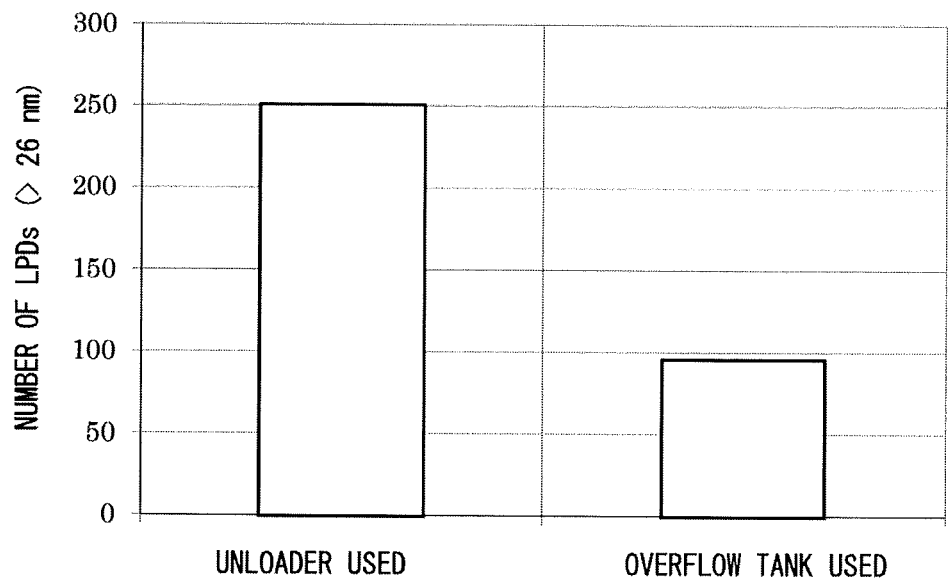
FIG. 11 is a diagram showing the results of the number of LPDs in the case of using an unloader (Comparative Example 4), and in the case of detaching a wafer from a polishing head with the wafer surface in contact with a protective-film forming treatment liquid without using the unloader (Example 5).

As is clear from FIG. 11, in the case of using the unloader, deterioration of LPD number has been confirmed, due to peeling of the protective-film when the unloader is into contact with the wafer.

On the other hand, it is confirmed that the number of LPD decreased because the wafer was detached from the polishing head, having the protective-film, without touching to the unloader, when the wafer front surface is in contact with the protective-film forming treatment liquid in the overflow tank.

Next, the pressurization rate for the pressurized space was investigated for detachment of the semiconductor substrate from the polishing head.

After carrying out a rough polishing step, main (precision) polishing, a rinsing treatment, and a hydrophilizing treatment on the polishing table under the condition shown in the Table 1 above, the number of LPDs on the back surface of the wafer was investigated with varying the pressurization rate (1 to 8 kPa/sec) with the use of a surfactant solution including a water-soluble nonionic surfactant at a concentration of 1% by weight as the hydrophilizing treatment liquid. The adopted protective-film forming treatment liquid has the same composition as the hydrophilizing treatment liquid but at a concentration of 30% by weight. The results are shown in FIG. 12.

Figure 12:
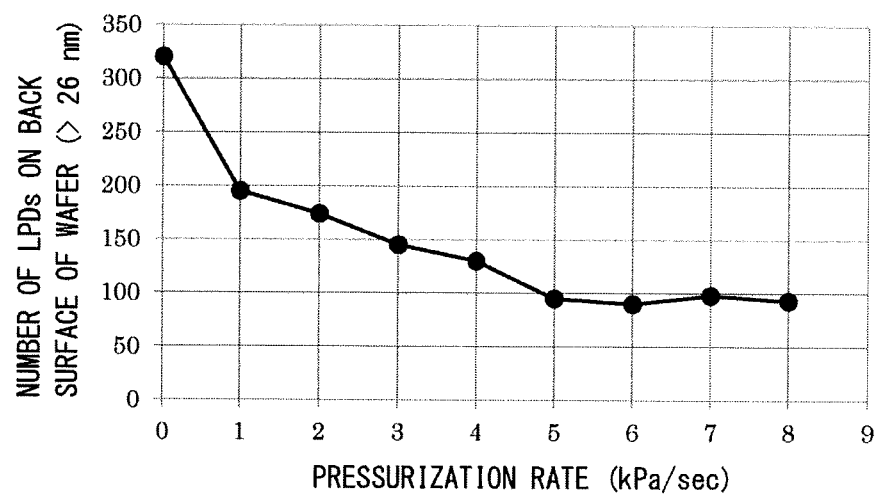
FIG. 12 is a diagram showing the relationship between the pressurization rate for a pressurized space for detaching a semiconductor substrate from a polishing head and the number of LPDs on a back surface of the wafer.

As is clear from FIG. 12, the pressurization rate less than 1 kPa/sec cannot detach the wafer from the polishing head (membrane), or because of the low speed of detaching the wafer, the wafer is not immersed in the protective-film forming treatment liquid on detachment of the wafer; this results in an increase in the number of LPDs.

In addition, the pressurization rate exceeds 8 kPa/sec, rupture of the membrane was observed. In contrast, with the pressurization rate in a range from 1 to 8 kPa/sec, the decreased number of LPDs was observed, and it is confirmed that the number of LPD further decreases in the range from 5 to 8 kPa/sec.

REFERENCE SIGNS LIST

A Rough polishing step
B Main polishing step
C Rinsing treatment step
D Hydrophilizing treatment step
E Protective-film forming treatment liquid contacting step
F Step of detaching from polishing head
G Cleaning step
X Polishing step
Y1 First protective-film forming step
Y2 Second protective-film forming step
W Wafer
3 Polishing head
9 Liquid tank
12 Protective-film forming treatment liquid (surfactant solution)

The invention claimed is:

1. A method for forming a protective-film for a semiconductor substrate, the method comprising:
    a polishing step of the semiconductor substrate using a polishing head, being pressurized and slid, for holding the semiconductor substrate and a surface plate with a polishing cloth attached thereto for polishing the semiconductor substrate while supplying an abrasive agent between the polishing cloth and the semiconductor substrate, to obtain a polished semiconductor substrate;
    a first protective-film forming step, after the polishing step, by hydrophilizing a front surface of the polished semiconductor substrate with a surfactant solution, in a state of the polished semiconductor substrate being held by the polishing head, without forming a protective-film before the polishing step by supplying the surfactant solution to a back surface of the semiconductor substrate; and
    a second protective-film forming step, after the first protective-film forming step, on the front surface and the back surface of the semiconductor substrate which has been transferred in a state of being held by the polishing head to a liquid surface of a protective-film forming treatment liquid by immersing the polished semiconductor substrate in the protective-film forming treatment liquid, the polished semiconductor substrate being detached from the polishing head with at least the front surface of the polished semiconductor substrate in contact with the liquid surface of the protective-film forming treatment liquid, the protective-film forming treatment liquid comprising the surfactant solution.

2. The method for forming a protective-film for a semiconductor substrate according to claim 1, wherein the protective-film forming treatment liquid has a surfactant concentration of from 1 to 50% by weight.

3. The method for forming a protective-film for a semiconductor substrate according to claim 1,
    wherein a head body of the polishing head comprises:
        a recess that is open downward and intended for holding the semiconductor substrate therein;
        a flow passage for supplying an air pressure to a pressurized space; and
        a membrane formed of a dish-shaped elastic material, the membrane attached to cover and close the recess, and
    wherein a pressurization rate for the pressurized space is from 1 to 8 kPa/sec for detaching the semiconductor substrate from the polishing head.

4. The method for forming a protective-film for a semiconductor substrate according to claim 1,
    wherein during the first protective-film forming step, the back surface of the semiconductor substrate is not in contact with the surfactant solution.

5. The method for forming a protective-film for a semiconductor substrate according to claim 1,
    wherein the first protective-film forming step is carried out by supplying the surfactant solution between the polishing cloth and the semiconductor substrate.

6. The method for forming a protective-film for a semiconductor substrate according to claim 1,
    wherein the polishing step and the first protective-film forming step are carried out simultaneously.

7. The method for forming a protective-film for a semiconductor substrate according to claim 1,
    wherein the polished semiconductor substrate is detached from the polishing head with both of the front surface and back surface of the polished semiconductor substrate in contact with the protective-film forming treatment liquid.

* * * * *